(12) United States Patent
Lee et al.

(10) Patent No.: US 12,245,367 B2
(45) Date of Patent: Mar. 4, 2025

(54) HEAD WEARABLE ELECTRONIC DEVICE AND METHOD FOR MANUFACTURING THE SAME

(71) Applicant: LG ELECTRONICS INC., Seoul (KR)

(72) Inventors: Haesun Lee, Seoul (KR); Hyeongseok Chae, Seoul (KR); Induck Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 631 days.

(21) Appl. No.: 16/488,930

(22) PCT Filed: Aug. 5, 2019

(86) PCT No.: PCT/KR2019/009715
§ 371 (c)(1),
(2) Date: Jul. 22, 2021

(87) PCT Pub. No.: WO2021/025190
PCT Pub. Date: Feb. 11, 2021

(65) Prior Publication Data
US 2021/0360778 A1    Nov. 18, 2021

(51) Int. Cl.
*H05K 1/02* (2006.01)
*G02B 27/01* (2006.01)
*G06F 3/01* (2006.01)

(52) U.S. Cl.
CPC ....... *H05K 1/0274* (2013.01); *G02B 27/0172* (2013.01); *G06F 3/011* (2013.01);
(Continued)

(58) Field of Classification Search
CPC .............. H05K 1/183; H05K 1/0274; H05K 2201/10151; G02B 27/0172
See application file for complete search history.

(56) References Cited

U.S. PATENT DOCUMENTS

| 10,261,549 B2* | 4/2019 | Han ............... G09G 5/10 |
| 10,602,039 B2* | 3/2020 | Nalla ............ H05K 1/0206 |
| 2018/0063508 A1* | 3/2018 | Trail ............ H04N 13/243 |

FOREIGN PATENT DOCUMENTS

| JP | 2002051268 | 2/2002 |
| JP | 2004120617 | 4/2004 |

(Continued)

OTHER PUBLICATIONS

PCT International Application No. PCT/KR2019/009715, International Search Report dated May 6, 2020, 3 pages.
(Continued)

*Primary Examiner* — James Wu
(74) *Attorney, Agent, or Firm* — LEE, HONG, DEGERMAN, KANG & WAIMEY

(57) ABSTRACT

Provided is an electronic device. The electronic device includes a cover allowing an external signal to pass therethrough, a circuit board provided on one side of the cover and having a first opening allowing the external signal to pass therethrough, and a sensing unit provided on one side of the circuit board and having a sensor part provided at a position corresponding to the first opening to receive the external signal. An electronic device according to the present invention may be associated with an artificial intelligence module, robot, augmented reality (AR) device, virtual reality (VR) device, and device related to 5G services.

13 Claims, 8 Drawing Sheets

(52) U.S. Cl.
CPC ............... *G02B 2027/0141* (2013.01); *H05K 2201/10151* (2013.01)

(56) References Cited

FOREIGN PATENT DOCUMENTS

| | | |
|---|---|---|
| KR | 1020110116847 | 10/2011 |
| KR | 10-2015-0146295 | 12/2015 |
| KR | 10-2016-0002190 | 1/2016 |
| KR | 101732040 | 5/2017 |
| KR | 1020190075045 | 6/2019 |

OTHER PUBLICATIONS

Korean Intellectual Property Office Application No. 10-2019-0116997, Office Action dated Mar. 20, 2024, 4 pages.

\* cited by examiner

HEAD WEARABLE ELECTRONIC DEVICE AND METHOD FOR MANUFACTURING THE SAME

CROSS-REFERENCE TO RELATED APPLICATIONS

This application is the National Stage filing under 35 U.S.C. 371 of International Application No. PCT/KR2019/009715, filed on Aug. 5, 2019, the contents of which are hereby incorporated by reference herein in its entirety.

BACKGROUND OF THE INVENTION

Field of the Invention

The present invention relates to an electronic device, and more specifically, to an electronic device used for virtual reality (VR), augmented reality (AR), mixed reality (MR), and the like, and a method for manufacturing the same.

Related Art

Virtual reality (VR) refers to a special environment or situation generated by man-made technology using computer and other devices, which is similar but not exactly equal to the real world.

Augmented reality (AR) refers to the technology that makes a virtual object or information interwoven with the real world, making the virtual object or information perceived as if exists in reality.

Mixed reality (MR) or hybrid reality refers to combining of the real world with virtual objects or information, generating a new environment or new information. In particular, mixed reality refers to the experience that physical and virtual objects interact with each other in real time.

The virtual environment or situation in a sense of mixed reality stimulates the five senses of a user, allows the user to have a spatio-temporal experience similar to the one perceived from the real world, and thereby allows the user to freely cross the boundary between reality and imagination. Also, the user may not only get immersed in such an environment but also interact with objects implemented in the environment by manipulating or giving a command to the objects through an actual device.

Recently, research into the gear specialized in the technical field above is being actively conducted.

In order to implement the VR, AR, or MR, various sensors must be installed in a device for display or a device for operation. In particular, an optical sensor or the like needs to be installed to send position information of a device to a controller. Here, in order to install the optical sensor in an existing device, a separate frame needs to be installed to support a circuit board on which the sensor is mounted, thereby increasing volume and weight.

SUMMARY OF THE INVENTION

The present invention provides an electronic device which does not require a separate frame because a circuit board on which a sensor is mounted is supported by a cover, when the electronic device is used for virtual reality (VR), augmented reality (AR), mixed reality (MR), and the like.

The present invention also provides a method for manufacturing an electronic device, which can solve a problem in that a process for spraying light blocking paint to an inner surface of a cover takes a long time and a defect rate increases.

In an aspect, an electronic device includes: a cover allowing an external signal to pass therethrough; a circuit board provided on one side of the cover and having a first opening allowing the external signal to pass therethrough; and a sensing unit provided on one side of the circuit board and having a sensor part provided at a position corresponding to the first opening to receive the external signal.

The electronic device may further include: a blocking member provided between the cover and the circuit board and preventing the external signal from passing therethrough, wherein the blocking member has a second opening formed at a position corresponding to the first opening to allow the external signal to pass therethrough.

The sensing unit may include a fixing part fixed around the first opening and an open portion exposed to the inside of the first opening, and the sensor part may be provided in the open portion.

A distance between an inner surface of the cover and one surface of the circuit board facing the inner surface of the cover may be shorter than a distance between the inner surface of the cover and one surface of the sensor part facing the inner surface of the cover.

One surface of the blocking member may be in contact with one surface of the circuit board facing the blocking member.

The blocking member may be stacked on one surface of the circuit board.

The blocking member may be stacked on the inner surface of the cover.

A region of the cover corresponding to the second opening may be thicker than a region of the cover in which the blocking member is disposed, and the region of the cover corresponding to the second opening may be coplanar with an inner surface of the blocking member.

The sensing unit may further include a blocking protrusion inserted into the first opening and preventing the external signal from passing therethrough, and the sensor part may be provided on an inner side of the blocking protrusion.

A blocking coating preventing the external signal from passing therethrough may be provided on an inner side of the blocking protrusion.

The blocking protrusion may have a recess formed on the inside thereof and the sensor part may be provided on a bottom surface of the recess.

One surface of the sensing unit on which the sensor part is provided may be located to be closer to the cover than to one surface of the circuit board facing the cover.

The sensing unit may include an insertion portion inserted into an inner side of the first opening, and the sensor part may be provided at an end portion of the insertion portion.

The sensing unit may further include a fixing part protruding radially around the insertion portion and fixed to one side of the circuit board.

In another aspect, an electronic device including at least one external controller receiving an external signal and transferring position information of a body part of a user and a display device displaying the position information from the external controller on a screen, wherein the external controller includes: a cover allowing an external signal to pass therethrough; a circuit board provided on one side of the cover and having a first opening allowing the external signal to pass therethrough; and a sensing unit provided on one side of the circuit board and having a sensor part provided at a position corresponding to the first opening to receive the external signal.

The display device may be a head-mounted display (HMD).

In another aspect, a method for manufacturing an electronic device receiving an external signal includes: forming a cover allowing the external signal to pass therethrough by an injection molding method; forming a blocking member preventing the external signal from passing therethrough on one surface of the cover by a double injection molding method and forming an opening in the blocking member such that a window allowing the external signal to pass therethrough; fixing a sensing unit having a sensor part to one surface of a circuit board having an opening, the sensor part being disposed at a position corresponding to the opening; and coupling one of the cover and the blocking member to the circuit board wherein a surface of the circuit board facing a surface thereof to which the sensing unit is fixed is disposed to be close to the blocking member.

The electronic device may receive the external signal and transfer position information of a body part of a user so that the position information is used in augmented reality (AR).

DESCRIPTION OF EXEMPLARY EMBODIMENTS

Figure 1:
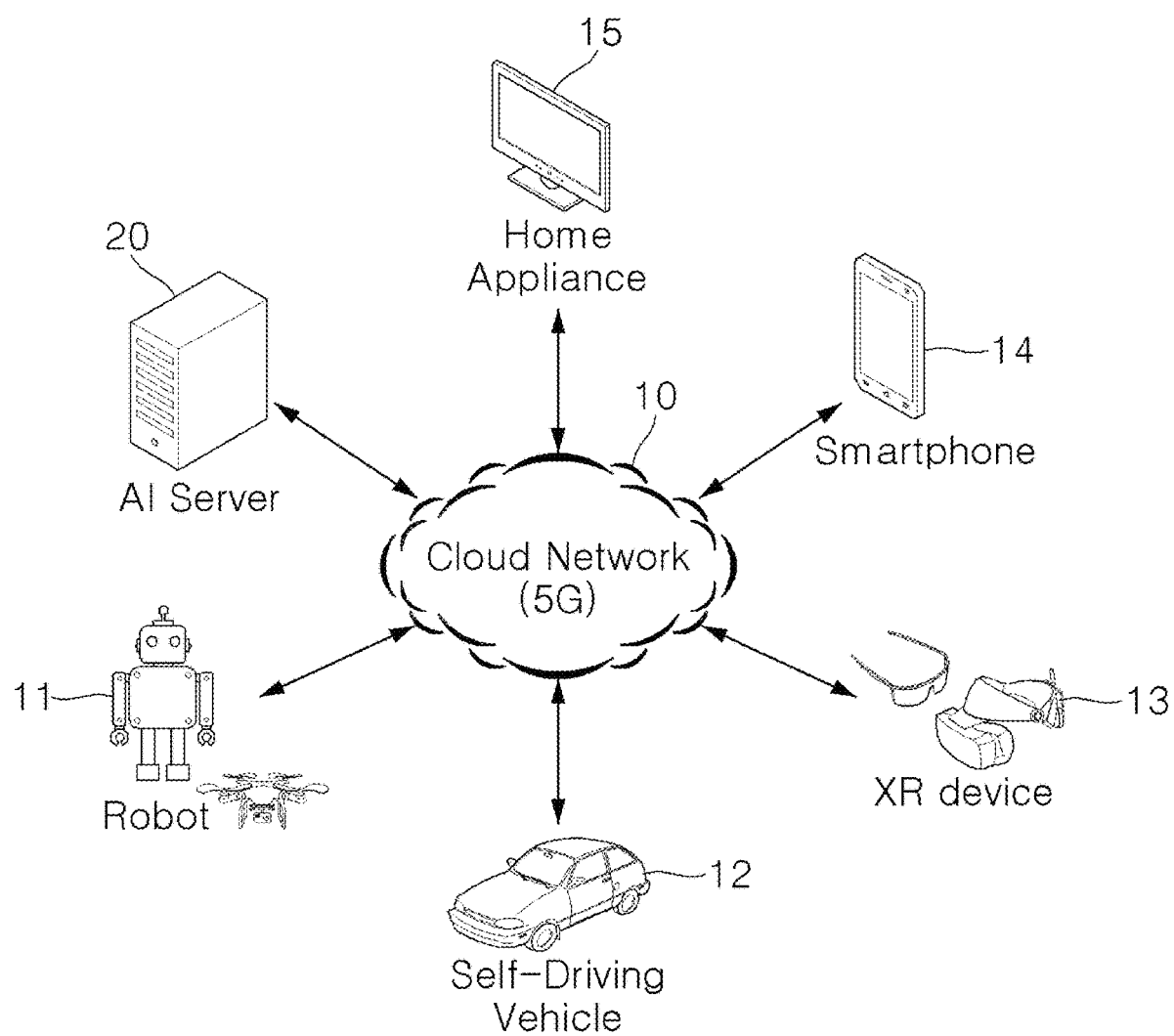
FIG. 1 illustrates one embodiment of an AI device.

In what follows, embodiments disclosed in this document will be described in detail with reference to appended drawings, where the same or similar constituent elements are given the same reference number irrespective of their drawing symbols, and repeated descriptions thereof will be omitted.

In describing an embodiment disclosed in the present specification, if a constituting element is said to be "connected" or "attached" to other constituting element, it should be understood that the former may be connected or attached directly to the other constituting element, but there may be a case in which another constituting element is present between the two constituting elements.

Also, in describing an embodiment disclosed in the present document, if it is determined that a detailed description of a related art incorporated herein unnecessarily obscure the gist of the embodiment, the detailed description thereof will be omitted. Also, it should be understood that the appended drawings are intended only to help understand embodiments disclosed in the present document and do not limit the technical principles and scope of the present invention; rather, it should be understood that the appended drawings include all of the modifications, equivalents or substitutes described by the technical principles and belonging to the technical scope of the present invention.

[5G Scenario]

The three main requirement areas in the 5G system are (1) enhanced Mobile Broadband (eMBB) area, (2) massive Machine Type Communication (mMTC) area, and (3) Ultra-Reliable and Low Latency Communication (URLLC) area.

Some use case may require a plurality of areas for optimization, but other use case may focus only one Key Performance Indicator (KPI). The 5G system supports various use cases in a flexible and reliable manner.

eMBB far surpasses the basic mobile Internet access, supports various interactive works, and covers media and entertainment applications in the cloud computing or augmented reality environment. Data is one of core driving elements of the 5G system, which is so abundant that for the first time, the voice-only service may be disappeared. In the 5G, voice is expected to be handled simply by an application program using a data connection provided by the communication system. Primary causes of increased volume of traffic are increase of content size and increase of the number of applications requiring a high data transfer rate. Streaming service (audio and video), interactive video, and mobile Internet connection will be more heavily used as more and more devices are connected to the Internet. These application programs require always-on connectivity to push real-time information and notifications to the user. Cloud-based storage and applications are growing rapidly in the mobile communication platforms, which may be applied to both of business and entertainment uses. And the cloud-based storage is a special use case that drives growth of uplink data transfer rate. The 5G is also used for cloud-based remote works and requires a much shorter end-to-end latency to ensure excellent user experience when a tactile interface is used. Entertainment, for example, cloud-based game and video streaming, is another core element that strengthens the requirement for mobile broadband capability. Entertainment is essential for smartphones and tablets in any place including a high mobility environment such as a train, car, and plane. Another use case is augmented reality for entertainment and information search. Here, augmented reality requires very low latency and instantaneous data transfer.

Also, one of highly expected 5G use cases is the function that connects embedded sensors seamlessly in every possible area, namely the use case based on mMTC. Up to 2020, the number of potential IoT devices is expected to reach 20.4 billion. Industrial IoT is one of key areas where the 5G performs a primary role to maintain infrastructure for smart city, asset tracking, smart utility, agriculture and security.

URLLC includes new services which may transform industry through ultra-reliable/ultra-low latency links, such as remote control of major infrastructure and self-driving cars. The level of reliability and latency are essential for smart grid control, industry automation, robotics, and drone control and coordination.

Next, a plurality of use cases will be described in more detail.

The 5G may complement Fiber-To-The-Home (FTTH) and cable-based broadband (or DOCSIS) as a means to provide a stream estimated to occupy hundreds of megabits per second up to gigabits per second. This fast speed is required not only for virtual reality and augmented reality but also for transferring video with a resolution more than 4K (6K, 8K or more). VR and AR applications almost always include immersive sports games. Specific application programs may require a special network configuration. For example, in the case of VR game, to minimize latency, game service providers may have to integrate a core server with the edge network service of the network operator.

Automobiles are expected to be a new important driving force for the 5G system together with various use cases of mobile communication for vehicles. For example, entertainment for passengers requires high capacity and high mobile broadband at the same time. This is so because users continue to expect a high-quality connection irrespective of their location and moving speed. Another use case in the automotive field is an augmented reality dashboard. The augmented reality dashboard overlays information, which is a perception result of an object in the dark and contains distance to the object and object motion, on what is seen through the front window. In a future, a wireless module enables communication among vehicles, information exchange between a vehicle and supporting infrastructure, and information exchange among a vehicle and other connected devices (for example, devices carried by a pedestrian). A safety system guides alternative courses of driving so that a driver may drive his or her vehicle more safely and to reduce the risk of accident. The next step will be a remotely driven or self-driven vehicle. This step requires highly reliable and highly fast communication between different self-driving vehicles and between a self-driving vehicle and infrastructure. In the future, it is expected that a self-driving vehicle takes care of all of the driving activities while a human driver focuses on dealing with an abnormal driving situation that the self-driving vehicle is unable to recognize. Technical requirements of a self-driving vehicle demand ultra-low latency and ultra-fast reliability up to the level that traffic safety may not be reached by human drivers.

The smart city and smart home, which are regarded as essential to realize a smart society, will be embedded into a high-density wireless sensor network. Distributed networks comprising intelligent sensors may identify conditions for cost-efficient and energy-efficient conditions for maintaining cities and homes. A similar configuration may be applied for each home. Temperature sensors, window and heating controllers, anti-theft alarm devices, and home appliances will be all connected wirelessly. Many of these sensors typified with a low data transfer rate, low power, and low cost. However, for example, real-time HD video may require specific types of devices for the purpose of surveillance.

As consumption and distribution of energy including heat or gas is being highly distributed, automated control of a distributed sensor network is required. A smart grid collects information and interconnect sensors by using digital information and communication technologies so that the distributed sensor network operates according to the collected information. Since the information may include behaviors of energy suppliers and consumers, the smart grid may help improving distribution of fuels such as electricity in terms of efficiency, reliability, economics, production sustainability, and automation. The smart grid may be regarded as a different type of sensor network with a low latency.

The health-care sector has many application programs that may benefit from mobile communication. A communication system may support telemedicine providing a clinical care from a distance. Telemedicine may help reduce barriers to distance and improve access to medical services that are not readily available in remote rural areas. It may also be used to save lives in critical medical and emergency situations. A wireless sensor network based on mobile communication may provide remote monitoring and sensors for parameters such as the heart rate and blood pressure.

Wireless and mobile communication are becoming increasingly important for industrial applications. Cable wiring requires high installation and maintenance costs. Therefore, replacement of cables with reconfigurable wireless links is an attractive opportunity for many industrial applications. However, to exploit the opportunity, the wireless connection is required to function with a latency similar to that in the cable connection, to be reliable and of large capacity, and to be managed in a simple manner. Low latency and very low error probability are new requirements that lead to the introduction of the 5G system.

Logistics and freight tracking are important use cases of mobile communication, which require tracking of an inventory and packages from any place by using location-based information system. The use of logistics and freight tracking typically requires a low data rate but requires large-scale and reliable location information.

The present invention to be described below may be implemented by combining or modifying the respective embodiments to satisfy the aforementioned requirements of the 5G system.

FIG. 1 illustrates one embodiment of an AI device.

Referring to FIG. 1, in the AI system, at least one or more of an AI server 16, robot 11, self-driving vehicle 12, XR device 13, smartphone 14, or home appliance 15 are connected to a cloud network 10. Here, the robot 11, self-driving vehicle 12, XR device 13, smartphone 14, or home appliance 15 to which the AI technology has been applied may be referred to as an AI device (11 to 15).

The cloud network 10 may comprise part of the cloud computing infrastructure or refer to a network existing in the cloud computing infrastructure. Here, the cloud network 10 may be constructed by using the 3G network, 4G or Long Term Evolution (LTE) network, or 5G network.

In other words, individual devices (11 to 16) constituting the AI system may be connected to each other through the cloud network 10. In particular, each individual device (11 to 16) may communicate with each other through the eNB but may communicate directly to each other without relying on the eNB.

The AI server 16 may include a server performing AI processing and a server performing computations on big data.

The AI server 16 may be connected to at least one or more of the robot 11, self-driving vehicle 12, XR device 13, smartphone 14, or home appliance 15, which are AI devices constituting the AI system, through the cloud network 10 and may help at least part of AI processing conducted in the connected AI devices (11 to 15).

At this time, the AI server 16 may teach the artificial neural network according to a machine learning algorithm on behalf of the AI device (11 to 15), directly store the learning model, or transmit the learning model to the AI device (11 to 15).

At this time, the AI server 16 may receive input data from the AI device (11 to 15), infer a result value from the received input data by using the learning model, generate a response or control command based on the inferred result value, and transmit the generated response or control command to the AI device (11 to 15).

Similarly, the AI device (11 to 15) may infer a result value from the input data by employing the learning model directly and generate a response or control command based on the inferred result value.

<AI+Robot>

By employing the AI technology, the robot 11 may be implemented as a guide robot, transport robot, cleaning robot, wearable robot, entertainment robot, pet robot, or unmanned flying robot.

The robot 11 may include a robot control module for controlling its motion, where the robot control module may correspond to a software module or a chip which implements the software module in the form of a hardware device.

The robot 11 may obtain status information of the robot 11, detect (recognize) the surroundings and objects, generate map data, determine a travel path and navigation plan, determine a response to user interaction, or determine motion by using sensor information obtained from various types of sensors.

Here, the robot 11 may use sensor information obtained from at least one or more sensors among lidar, radar, and camera to determine a travel path and navigation plan.

The robot 11 may perform the operations above by using a learning model built on at least one or more artificial neural networks. For example, the robot 11 may recognize the surroundings and objects by using the learning model and determine its motion by using the recognized surroundings or object information. Here, the learning model may be the one trained by the robot 11 itself or trained by an external device such as the AI server 16.

At this time, the robot 11 may perform the operation by generating a result by employing the learning model directly but also perform the operation by transmitting sensor information to an external device such as the AI server 16 and receiving a result generated accordingly.

The robot 11 may determine a travel path and navigation plan by using at least one or more of object information detected from the map data and sensor information or object information obtained from an external device and navigate according to the determined travel path and navigation plan by controlling its locomotion platform.

Map data may include object identification information about various objects disposed in the space in which the robot 11 navigates. For example, the map data may include object identification information about static objects such as wall and doors and movable objects such as a flowerpot and a desk. And the object identification information may include the name, type, distance, location, and so on.

Also, the robot 11 may perform the operation or navigate the space by controlling its locomotion platform based on the control/interaction of the user. At this time, the robot 11 may obtain intention information of the interaction due to the user's motion or voice command and perform an operation by determining a response based on the obtained intention information.

<AI+Autonomous Navigation>

By employing the AI technology, the self-driving vehicle 12 may be implemented as a mobile robot, unmanned ground vehicle, or unmanned aerial vehicle.

The self-driving vehicle 12 may include an autonomous navigation module for controlling its autonomous navigation function, where the autonomous navigation control module may correspond to a software module or a chip which implements the software module in the form of a hardware device. The autonomous navigation control module may be installed inside the self-driving vehicle 12 as a constituting element thereof or may be installed outside the self-driving vehicle 12 as a separate hardware component.

The self-driving vehicle 12 may obtain status information of the self-driving vehicle 12, detect (recognize) the surroundings and objects, generate map data, determine a travel path and navigation plan, or determine motion by using sensor information obtained from various types of sensors.

Like the robot 11, the self-driving vehicle 12 may use sensor information obtained from at least one or more sensors among lidar, radar, and camera to determine a travel path and navigation plan.

In particular, the self-driving vehicle 12 may recognize an occluded area or an area extending over a predetermined distance or objects located across the area by collecting sensor information from external devices or receive recognized information directly from the external devices.

The self-driving vehicle 12 may perform the operations above by using a learning model built on at least one or more artificial neural networks. For example, the self-driving vehicle 12 may recognize the surroundings and objects by using the learning model and determine its navigation route by using the recognized surroundings or object information. Here, the learning model may be the one trained by the self-driving vehicle 12 itself or trained by an external device such as the AI server 16.

At this time, the self-driving vehicle 12 may perform the operation by generating a result by employing the learning model directly but also perform the operation by transmitting sensor information to an external device such as the AI server 16 and receiving a result generated accordingly.

The self-driving vehicle 12 may determine a travel path and navigation plan by using at least one or more of object information detected from the map data and sensor information or object information obtained from an external device and navigate according to the determined travel path and navigation plan by controlling its driving platform.

Map data may include object identification information about various objects disposed in the space (for example, road) in which the self-driving vehicle 12 navigates. For example, the map data may include object identification information about static objects such as streetlights, rocks and buildings and movable objects such as vehicles and pedestrians. And the object identification information may include the name, type, distance, location, and so on.

Also, the self-driving vehicle 12 may perform the operation or navigate the space by controlling its driving platform based on the control/interaction of the user. At this time, the self-driving vehicle 12 may obtain intention information of the interaction due to the user's motion or voice command and perform an operation by determining a response based on the obtained intention information.

<AI+XR>

By employing the AI technology, the XR device 13 may be implemented as a Head-Mounted Display (HMD), Head-Up Display (HUD) installed at the vehicle, TV, mobile phone, smartphone, computer, wearable device, home appliance, digital signage, vehicle, robot with a fixed platform, or mobile robot.

The XR device 13 may obtain information about the surroundings or physical objects by generating position and attribute data about 3D points by analyzing 3D point cloud or image data acquired from various sensors or external devices and output objects in the form of XR objects by rendering the objects for display.

The XR device 13 may perform the operations above by using a learning model built on at least one or more artificial neural networks. For example, the XR device 13 may recognize physical objects from 3D point cloud or image data by using the learning model and provide information corresponding to the recognized physical objects. Here, the learning model may be the one trained by the XR device 13 itself or trained by an external device such as the AI server 16.

At this time, the XR device 13 may perform the operation by generating a result by employing the learning model directly but also perform the operation by transmitting sensor information to an external device such as the AI server 16 and receiving a result generated accordingly.

<AI+Robot+Autonomous Navigation>

By employing the AI and autonomous navigation technologies, the robot 11 may be implemented as a guide robot, transport robot, cleaning robot, wearable robot, entertainment robot, pet robot, or unmanned flying robot.

The robot 11 employing the AI and autonomous navigation technologies may correspond to a robot itself having an autonomous navigation function or a robot 11 interacting with the self-driving vehicle 12.

The robot 11 having the autonomous navigation function may correspond collectively to the devices which may move autonomously along a given path without control of the user or which may move by determining its path autonomously.

The robot 11 and the self-driving vehicle 12 having the autonomous navigation function may use a common sensing method to determine one or more of the travel path or navigation plan. For example, the robot 11 and the self-driving vehicle 12 having the autonomous navigation function may determine one or more of the travel path or navigation plan by using the information sensed through lidar, radar, and camera.

The robot 11 interacting with the self-driving vehicle 12, which exists separately from the self-driving vehicle 12, may be associated with the autonomous navigation function inside or outside the self-driving vehicle 12 or perform an operation associated with the user riding the self-driving vehicle 12.

At this time, the robot 11 interacting with the self-driving vehicle 12 may obtain sensor information in place of the self-driving vehicle 12 and provide the sensed information to the self-driving vehicle 12; or may control or assist the autonomous navigation function of the self-driving vehicle 12 by obtaining sensor information, generating information of the surroundings or object information, and providing the generated information to the self-driving vehicle 12.

Also, the robot 11 interacting with the self-driving vehicle 12 may control the function of the self-driving vehicle 12 by monitoring the user riding the self-driving vehicle 12 or through interaction with the user. For example, if it is determined that the driver is drowsy, the robot 11 may activate the autonomous navigation function of the self-driving vehicle 12 or assist the control of the driving platform of the self-driving vehicle 12. Here, the function of the self-driving vehicle 12 controlled by the robot 12 may include not only the autonomous navigation function but also the navigation system installed inside the self-driving vehicle 12 or the function provided by the audio system of the self-driving vehicle 12.

Also, the robot 11 interacting with the self-driving vehicle 12 may provide information to the self-driving vehicle 12 or assist functions of the self-driving vehicle 12 from the outside of the self-driving vehicle 12. For example, the robot 11 may provide traffic information including traffic sign information to the self-driving vehicle 12 like a smart traffic light or may automatically connect an electric charger to the charging port by interacting with the self-driving vehicle 12 like an automatic electric charger of the electric vehicle.

<AI+Robot+Xr>

By employing the AI technology, the robot 11 may be implemented as a guide robot, transport robot, cleaning robot, wearable robot, entertainment robot, pet robot, or unmanned flying robot.

The robot 11 employing the XR technology may correspond to a robot which acts as a control/interaction target in the XR image. In this case, the robot 11 may be distinguished from the XR device 13, both of which may operate in conjunction with each other.

If the robot 11, which acts as a control/interaction target in the XR image, obtains sensor information from the sensors including a camera, the robot 11 or XR device 13 may generate an XR image based on the sensor information, and the XR device 13 may output the generated XR image. And the robot 11 may operate based on the control signal received through the XR device 13 or based on the interaction with the user.

For example, the user may check the XR image corresponding to the viewpoint of the robot 11 associated remotely through an external device such as the XR device 13, modify the navigation path of the robot 11 through interaction, control the operation or navigation of the robot 11, or check the information of nearby objects.

<AI+Autonomous Navigation+XR>

By employing the AI and XR technologies, the self-driving vehicle 12 may be implemented as a mobile robot, unmanned ground vehicle, or unmanned aerial vehicle.

The self-driving vehicle 12 employing the XR technology may correspond to a self-driving vehicle having a means for providing XR images or a self-driving vehicle which acts as a control/interaction target in the XR image. In particular, the self-driving vehicle 12 which acts as a control/interaction target in the XR image may be distinguished from the XR device 13, both of which may operate in conjunction with each other.

The self-driving vehicle 12 having a means for providing XR images may obtain sensor information from sensors including a camera and output XR images generated based on the sensor information obtained. For example, by displaying an XR image through HUD, the self-driving vehicle 12 may provide XR images corresponding to physical objects or image objects to the passenger.

At this time, if an XR object is output on the HUD, at least part of the XR object may be output so as to be overlapped with the physical object at which the passenger gazes. On the other hand, if an XR object is output on a display installed inside the self-driving vehicle 12, at least part of the XR object may be output so as to be overlapped with an image object. For example, the self-driving vehicle 12 may output XR objects corresponding to the objects such as roads, other vehicles, traffic lights, traffic signs, bicycles, pedestrians, and buildings.

If the self-driving vehicle 12, which acts as a control/interaction target in the XR image, obtains sensor information from the sensors including a camera, the self-driving vehicle 12 or XR device 13 may generate an XR image based on the sensor information, and the XR device 13 may output the generated XR image. And the self-driving vehicle 12 may operate based on the control signal received through an external device such as the XR device 13 or based on the interaction with the user.

[Extended Reality Technology]

eXtended Reality (XR) refers to all of Virtual Reality (VR), Augmented Reality (AR), and Mixed Reality (MR). The VR technology provides objects or backgrounds of the real world only in the form of CG images, AR technology provides virtual CG images overlaid on the physical object images, and MR technology employs computer graphics technology to mix and merge virtual objects with the real world.

MR technology is similar to AR technology in a sense that physical objects are displayed together with virtual objects. However, while virtual objects supplement physical objects in the AR, virtual and physical objects co-exist as equivalents in the MR.

The XR technology may be applied to Head-Mounted Display (HMD), Head-Up Display (HUD), mobile phone, tablet PC, laptop computer, desktop computer, TV, digital signage, and so on, where a device employing the XR technology may be called an XR device.

In what follows, an electronic device providing XR according to an embodiment of the present invention will be described.

Figure 2:
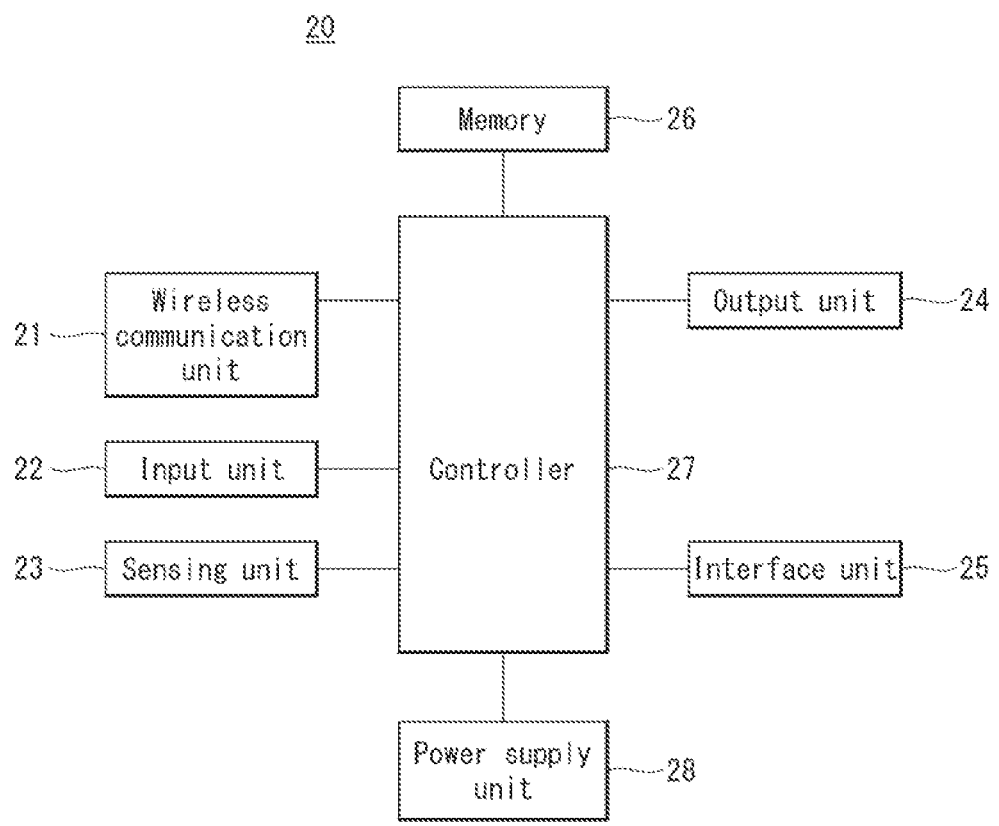
FIG. 2 is a block diagram illustrating the structure of an eXtended Reality (XR) electronic device according to one embodiment of the present invention.

FIG. 2 is a block diagram illustrating the structure of an XR electronic device 20 according to one embodiment of the present invention.

Referring to FIG. 2, the XR electronic device 20 may include a wireless communication unit 21, input unit 22, sensing unit 23, output unit 24, interface unit 25, memory 26, controller 27, and power supply unit 28. The constituting elements shown in FIG. 2 are not essential for implementing the electronic device 20, and therefore, the electronic device 20 described in this document may have more or fewer constituting elements than those listed above.

More specifically, among the constituting elements above, the wireless communication unit 21 may include one or more modules which enable wireless communication between the electronic device 20 and a wireless communication system, between the electronic device 20 and other electronic device, or between the electronic device 20 and an external server. Also, the wireless communication unit 21 may include one or more modules that connect the electronic device 20 to one or more networks.

The wireless communication unit 21 may include at least one of a broadcast receiving module, mobile communication module, wireless Internet module, short-range communication module, and location information module.

The input unit 22 may include a camera or image input unit for receiving an image signal, microphone or audio input unit for receiving an audio signal, and user input unit (for example, touch key) for receiving information from the user, and push key (for example, mechanical key). Voice data or image data collected by the input unit 22 may be analyzed and processed as a control command of the user.

The sensing unit 23 may include one or more sensors for sensing at least one of the surroundings of the electronic device 20 and user information.

For example, the sensing unit 23 may include at least one of a proximity sensor, illumination sensor, touch sensor, acceleration sensor, magnetic sensor, G-sensor, gyroscope sensor, motion sensor, RGB sensor, infrared (IR) sensor, finger scan sensor, ultrasonic sensor, optical sensor (for example, image capture means), microphone, battery gauge, environment sensor (for example, barometer, hygrometer, radiation detection sensor, heat detection sensor, and gas detection sensor), and chemical sensor (for example, electronic nose, health-care sensor, and biometric sensor). Meanwhile, the electronic device 20 disclosed in the present specification may utilize information collected from at least two or more sensors listed above.

The output unit 24 is intended to generate an output related to a visual, aural, or tactile stimulus and may include at least one of a display unit, sound output unit, haptic module, and optical output unit. The display unit may implement a touchscreen by forming a layered structure or being integrated with touch sensors. The touchscreen may not only function as a user input means for providing an input interface between the AR electronic device 20 and the user but also provide an output interface between the AR electronic device 20 and the user.

The interface unit 25 serves as a path to various types of external devices connected to the electronic device 20. Through the interface unit 25, the electronic device 20 may receive VR or AR content from an external device and perform interaction by exchanging various input signals, sensing signals, and data.

For example, the interface unit 25 may include at least one of a wired/wireless headset port, external charging port, wired/wireless data port, memory card port, port for connecting to a device equipped with an identification module, audio Input/Output (I/O) port, video I/O port, and earphone port.

Also, the memory 26 stores data supporting various functions of the electronic device 20. The memory 26 may store a plurality of application programs (or applications) executed in the electronic device 20; and data and commands for operation of the electronic device 20. Also, at least part of the application programs may be pre-installed at the electronic device 20 from the time of factory shipment for basic functions (for example, incoming and outgoing call function and message reception and transmission function) of the electronic device 20.

The controller 27 usually controls the overall operation of the electronic device 20 in addition to the operation related to the application program. The controller 27 may process signals, data, and information input or output through the constituting elements described above.

Also, the controller 27 may provide relevant information or process a function for the user by executing an application program stored in the memory 26 and controlling at least part of the constituting elements. Furthermore, the controller 27 may combine and operate at least two or more constituting elements among those constituting elements included in the electronic device 20 to operate the application program.

Also, the controller 27 may detect the motion of the electronic device 20 or user by using a gyroscope sensor, g-sensor, or motion sensor included in the sensing unit 23. Also, the controller 27 may detect an object approaching the vicinity of the electronic device 20 or user by using a proximity sensor, illumination sensor, magnetic sensor, infrared sensor, ultrasonic sensor, or light sensor included in the sensing unit 23. Besides, the controller 27 may detect the motion of the user through sensors installed at the controller operating in conjunction with the electronic device 20.

Also, the controller 27 may perform the operation (or function) of the electronic device 20 by using an application program stored in the memory 26.

The power supply unit 28 receives external or internal power under the control of the controller 27 and supplies the power to each and every constituting element included in the electronic device 20. The power supply unit 28 includes battery, which may be provided in a built-in or replaceable form.

At least part of the constituting elements described above may operate in conjunction with each other to implement the operation, control, or control method of the electronic device according to various embodiments described below. Also, the operation, control, or control method of the electronic device may be implemented on the electronic device by executing at least one application program stored in the memory 26.

In what follows, the electronic device according to one embodiment of the present invention will be described with reference to an example where the electronic device is applied to a Head Mounted Display (HMD). However, embodiments of the electronic device according to the present invention may include a mobile phone, smartphone, laptop computer, digital broadcast terminal, Personal Digital Assistant (PDA), Portable Multimedia Player (PMP), navigation terminal, slate PC, tablet PC, ultrabook, and wearable device. Wearable devices may include smart watch and contact lens in addition to the HMD.

Figure 3:
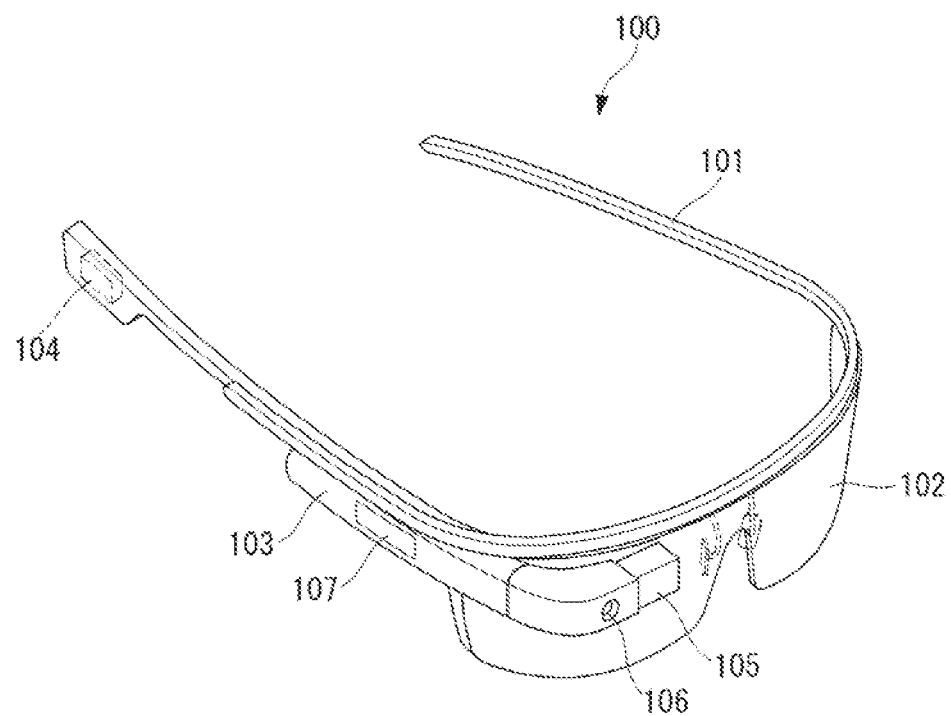
FIG. 3 is a perspective view of an augmented reality (AR) electronic device according to an embodiment of the present invention.

FIG. 3 is a perspective view of an augmented reality (AR) electronic device according to an embodiment of the present invention.

Referring to FIG. 3, the AR electronic device may be provided as a glass type. The glass type electronic device 100 may be configured to be worn on a head of a human body and may include a frame part (case, housing, etc.) 101 therefor. The frame part may be formed of a flexible material to facilitate wearing.

The frame part 101 is supported on the head and provides a space in which various components are mounted. As illustrated, electronic components such as a controller 103, an audio output unit 104, and the like may be mounted in the frame part 101. Further, a lens 102 covering at least one of a left eye and a right eye may be detachably mounted on the frame part.

The controller 103 is configured to control various electronic components provided in the electronic device 100. In the drawing, the controller 103 is illustrated to be installed in the frame part on one side of the head. However, the position of the controller 103 is not limited thereto.

The display portion 105 may be implemented as a head-mounted display (HMD) type. The HMD type is a display scheme mounted on the head part and showing an image directly in front of the user's eyes. When the user wears the glass type electronic device 100, the display portion 105 may be disposed to correspond to at least one of the left eye and the right eye to provide an image directly in front of the user's eyes. In the drawing, the display portion 105 is illustrated to be positioned at a portion corresponding to the right eye so that an image may be output toward the right eye of the user.

The display portion 105 may project an image to a display area using a prism. Further, the prism may be formed to be translucent so that the user may see the projected image together with a general field of view (a range the user sees through the eye) together.

As such, the image output through the display portion 105 may appear to overlap the general field of view. The electronic device 100 may provide augmented reality (AR) that displays a single image by superimposing a virtual image on a real image or a background using such characteristics of the display.

An image capturing unit 106 is disposed adjacent to at least one of the left eye and the right eye and captures an image of a front side. Since the image capturing unit 106 is positioned adjacent to the eye, the image capturing unit 106 may obtain a scene viewed by the user as an image.

In this drawing, the image capturing unit 106 is illustrated to be included in the control module 103 but is not necessarily limited thereto. The image capturing unit 106 may be installed in the frame part 101 or may be provided in plurality to obtain a stereoscopic image.

The glass type electronic device 100 may include a user input unit 107 operated to receive a control command. The user input unit 107 may employ various schemes including a scheme in which the user operates the user input unit 107 in a tactile manner such as a touch or a push, a gesture scheme of recognizing a movement of the user's hand without directly touching, or a scheme of recognizing a voice command. In the drawing, the user input unit 107 based on the push and touch input scheme is provided in the frame part or the control module 480.

Further, the glass-type electronic device 100 may include a microphone for receiving sound and processing it as electrical voice data and an audio output unit 104 for outputting sound. The audio output unit 104 may be configured to transfer sound according to a general sound output method or a bone conduction method. If the audio output unit 104 is implemented in the bone conduction manner, when the user wears the electronic device 100, the audio output unit 104 is in close contact with the head and vibrates a skull to transmit sound.

Figure 4:
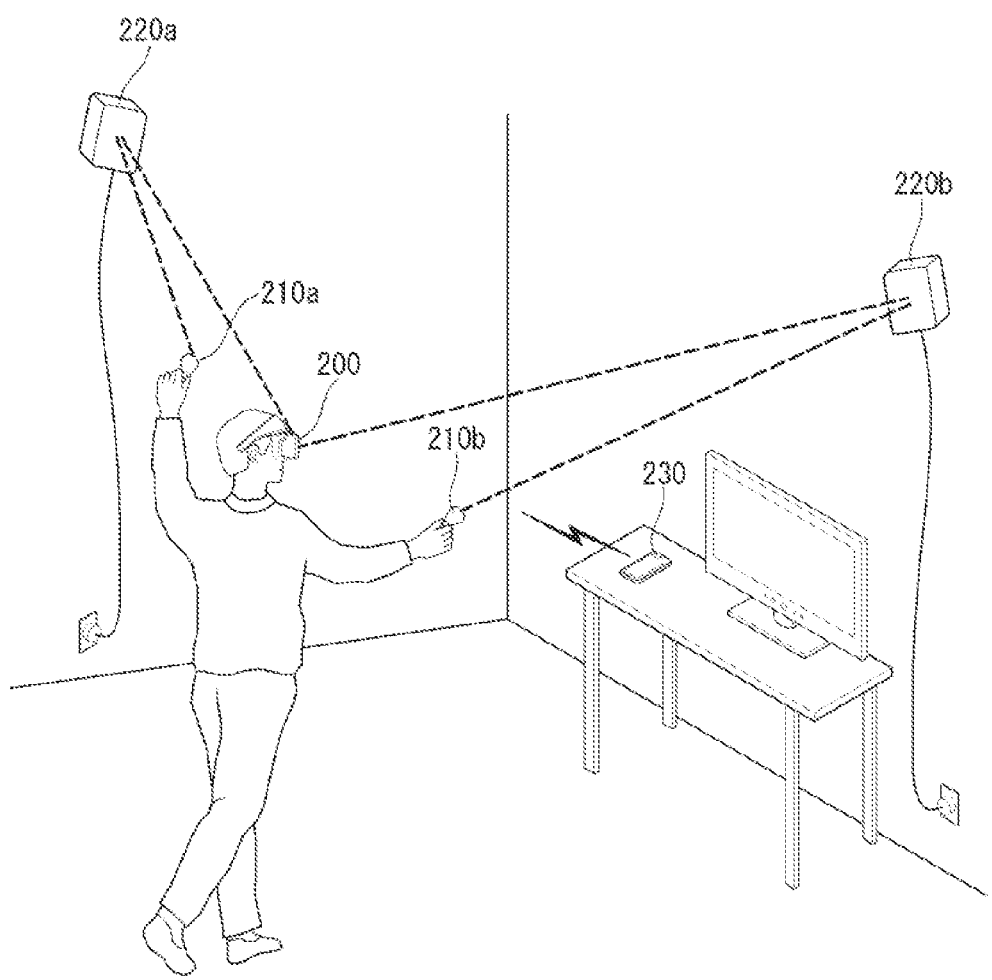
FIG. 4 is a view illustrating a state of using a virtual reality (VR) electronic device.
Figure 5:
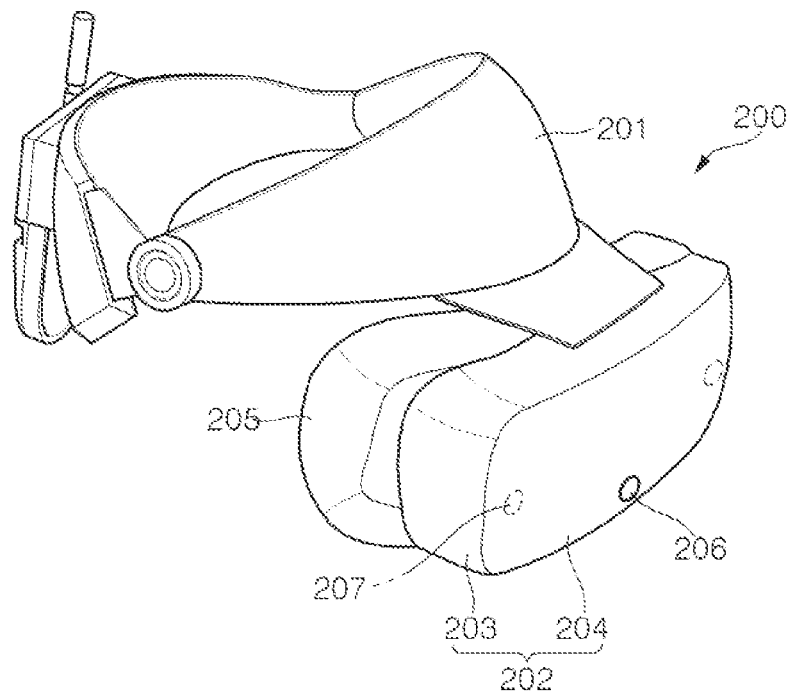
FIG. 5 is a perspective view of a VR electronic device according to another embodiment of the present invention.
Figure 6:
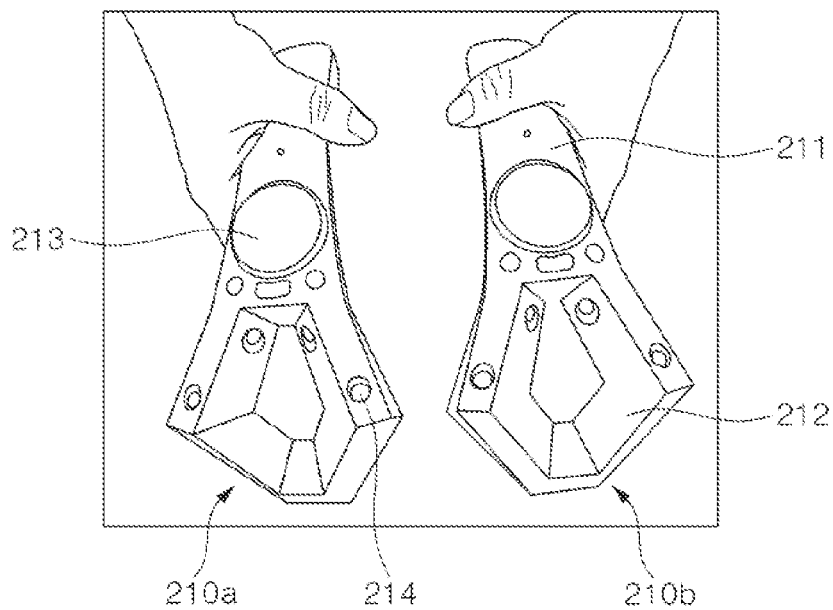
FIG. 6 is a view illustrating a controller used in a VR electronic device.

FIG. 4 is a view illustrating a state of using a VR electronic device, and FIG. 5 is a perspective view of a VR electronic device according to another embodiment of the present invention. FIG. 6 is a view illustrating a controller used in a VR electronic device.

Referring to the drawings, the VR electronic device may include a VR electronic device 200 mounted on the user's head and a controller 210 (210a, 210b) that the user may grip and operate.

The VR electronic device 200 includes a head unit 201 worn and supported on the head of a human body and a display unit coupled to the head unit 201 to display a virtual image or an image in front of a user's eyes (202). Although the head unit 201 and the display unit 202 are illustrated as being configured as separate units and coupled to each other, the display unit 202 may alternatively be integrally formed with the head unit 201.

The head unit 201 may adopt a structure that surrounds the user's head so as to disperse the weight of the display unit 202 having a sense of weight. Also, a variable length band and the like may be provided to match a head size of different users.

The display unit 202 constitutes a cover portion 203 coupled to the head portion 201 and a display portion 204 accommodating the display panel therein.

The cover portion 203 may also be called a goggle frame and may have a tub shape as a whole. The cover portion 203 has a space formed therein and an opening corresponding to a position of the eyeball of the user on a front surface thereof.

The display portion 204 is mounted on a front frame of the cover portion 203 and is provided at a position corresponding to both eyes of the user to output screen information (image, etc.). The screen information output from the display portion 204 includes not only VR content but also an external image collected through an image capturing unit such as a camera.

The VR content output on the display portion 204 may be VR content stored in the electronic device 100 itself or stored in the external device 230. For example, when the screen information is a virtual space image stored in the electronic device 100, the electronic device 100 performs image processing and rendering processing to process the image of the virtual space and output image information generated as a result of the image processing and rendering processing through the display portion 204. Meanwhile, in the case of the VR image stored in the external device 230, the external device 230 may perform image processing and rendering processing thereon and transmit resultantly generated image information to the electronic device 100. Then, the electronic device 100 may output the 3D image information received from the external device 230 through the display portion 204.

The display portion 204 may include a display panel provided in front of the opening of the cover portion 203, and the display panel may be an LCD or an OLED panel. Alternatively, the display portion 204 may be a display portion of a smartphone. That is, a structure to which a smartphone is detachably attached may be provided on a front side of the cover portion 203.

In addition, an image capturing unit 206 and various sensing units 207 may be installed on a front side of the display unit 202.

The image capturing unit (e.g., camera) may capture (receive or input) an image of a front side, and in particular, may obtain a scene viewed by the user as an image. In FIG. 5, it is illustrated that one image capturing unit is provided at a central position of the display portion 204, but alternatively, two or more image capturing units may be provided at positions symmetrical to each other. In the case of having a plurality of image capturing units 206, a stereoscopic image may be obtained. An image obtained by combining a virtual image to an external image obtained from the image capturing unit 206 may be displayed through the display portion 204.

The sensing unit 207 may include a gyroscope sensor, a motion sensor, or an IR sensor. The sensing unit 207 may detect a position or movement of the user or detect a nearby object. In FIG. 5, it is illustrated that the sensing unit 207 is provided in plurality at symmetrical positions of the display portion 204, but alternatively, one sensing unit 207 may be provided or may be provided at a position other than the display portion 204.

The sensing unit 207 will be described in more detail later.

A facial pad 205 may be installed at the rear of the display unit 202. The facial pad 205 is adhered to the periphery of the user's eyeball and is formed of a material with cushioning sensation to provide a comfortable wear sensation to the user's face. Further, the facial pad 205 may be formed of a flexible material having a shape corresponding to the front contour of the face of a person and may be in close contact with the face of different users' faces, thereby preventing intrusion of external light to the eyes.

In addition, the VR electronic device may include a controller 210 (210a, 210b) as a peripheral device for controlling an operation related to a virtual space image displayed through the VR electronic device 200.

The controller 210 is provided in a form that a user may easily grip on both hands, and an outer surface thereof may include a touch pad (or track pad), a button, and the like for receiving a user input.

The controller 210 may be used to control a screen output on the display portion 204 interworking with the electronic device 200. The controller 210 may include a grip portion 211 gripped by the user and a head portion 212 extending from the grip portion 211 and having various sensors and a microprocessor embedded therein. The grip portion 211 may be formed in a long vertical bar shape so that the user may easily grip it, and the head portion 212 may be formed in a ring shape.

In addition, the controller 210 may include a user input unit 213 and a sensing unit 214.

The user input unit 213 may be provided in the grip portion 211 of the controller 210. The user input unit 213 may include, for example, keys disposed on one side of the grip portion 211, a touch pad (track pad) provided on one side of the grip portion 211, a trigger button, and the like.

In addition, the sensing unit 214 may be provided at the head portion 212 of the controller 210. The sensing unit 214 may include a gyroscope sensor, a motion sensor, or an IR sensor. The sensing unit 214 may detect a position or movement of the user or detect a nearby object. For example, the IR sensor is used to track a user motion by receiving light emitted from a location tracking device 220 (to be described later). The motion tracking sensor may be configured as an aggregate including a three-axis acceleration sensor, a three-axis gyroscope, and a digital motion.

In FIG. 6, it is illustrated that a plurality of sensing units 214 are provided at symmetrical positions on a front side of the head portion 212, but alternatively, a single sensing unit 214 may be provided or the sensing unit 214 may be provided at a position or other than the head portion 212.

The controller 200 may perform feedback corresponding to a signal received from a controller of the electronic device 100. For example, the controller 200 may transmit a feedback signal to the user through vibration, sound, or light.

Meanwhile, the user may approach an external environment image checked through the image capturing unit 206 provided in the electronic device 200 by operating the controller 210. That is, the user may immediately check the external environment through the operation of the controller 210 without removing the electronic device 200 even during a virtual space experience.

In addition, the VR electronic device may further include a position tracking device 220. The position tracking device 220 detects a position of the VR electronic device 200 or the controller 210 by applying a positional tracking technique called a lighthouse system, and helps track a 360-degree motion of the user using the detected position.

Referring to FIG. 4, the position tracking system may be implemented by installing one or more position tracking device 220 (220a, 220b) in a closed specific space. The plurality of position tracking devices 220 may be installed at positions where a recognizable space range is maximized, for example, at positions facing each other in a diagonal direction.

The electronic device 200 or the controller 210 may receive light emitted from the LEDs or the laser emitters included in the plurality of position tracking devices 220 and accurately determine a location of the user in the closed specific space on the basis of a correlation between a position to which the corresponding light is received and a time. To this end, each of the position tracking devices 220 may include an IR lamp and a two-axis motor, through which the location tracking devices 220 exchange signals with the VR electronic device 200 or the controller 210.

In addition, the VR electronic device 200 may perform wired/wireless communication with the external device. The VR electronic device 200 may receive a virtual space image stored in the connected external device 230 (e.g., a PC, a smartphone, or a tablet, etc.) and display the virtual space image for the user.

Meanwhile, the controller 210 and the position tracking device 220 described above are not essential components and may be omitted in the embodiment of the present invention. For example, the user input unit installed in the VR electronic device 200 may replace the controller 220 and determine position information by itself from the sensing unit 207 installed in the VR electronic device 200.

Next, an electronic device 500 according to an embodiment of the present invention will be described with reference to FIGS. 7 to 12.

Figure 7:
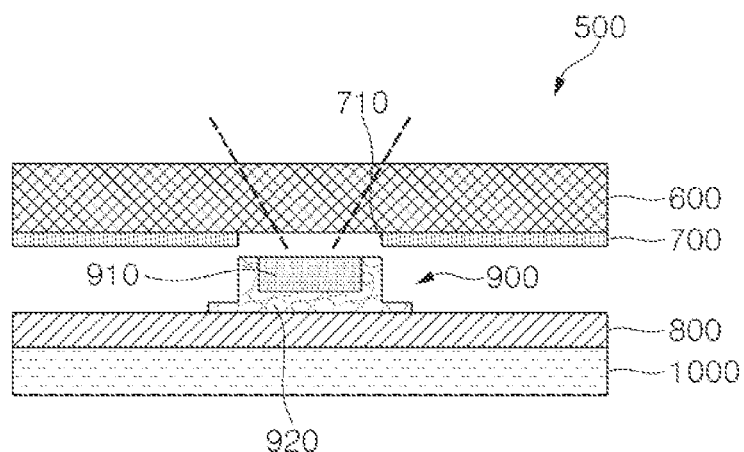
FIG. 7 is a cross-sectional view illustrating an electronic device according to a comparative embodiment of the present invention.
Figure 8:
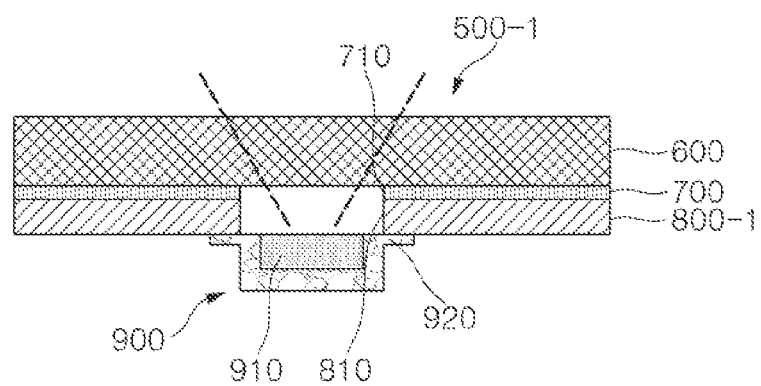
FIG. 8 is a cross-sectional view illustrating an electronic device according to a first embodiment of the present invention.

Referring to FIGS. 7 and 8, the electronic device 500 may include a cover 600 through which an external signal passes, a circuit board 800 provided on an inner side of the cover 600 and having an electronic circuit formed thereon, and a sensing unit 900 provided on a lower side of the circuit board 800 and receiving an external signal.

The cover 600 forms an outline of the electronic device 500 and protects a component such as the electronic circuit or the like provided in an internal space from external shocks. A microprocessor and various sensing units 900 may be accommodated in the internal space surrounded by the cover 600.

The circuit board 800 is a board on which a circuit connecting the microprocessor and the sensing unit 900 is formed, and may be provided as a flexible printed circuit board (PCB) 800 which may be bent or curved.

The circuit board 800 may include a source circuit board and a control circuit board according to types, and the source circuit board and the control circuit board may be connected through a flexible cable such as a flexible flat cable (FFC) or a flexible printed circuit (FPC).

The sensing unit 900 may include one or more sensors for sensing at least one of information in the electronic device, environment information surrounding the electronic device, and user information. The sensing unit 900 may include one or more sensors configured to sense internal information of the electronic device, information of a surrounding environment of the electronic device, and user information. For example, the sensing unit 130 may include at least one of a proximity sensor, an illumination sensor, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (e.g., image capturing unit), a microphone, a battery gauge, an environment sensor (e.g., a barometer, a hygrometer, a thermometer, a radiation detection sensor, a thermal sensor, and a gas sensor, etc.), and a chemical sensor (e.g., an electronic nose, a health care sensor, a biometric sensor, etc.).

A control unit (microprocessor) mounted on the circuit board 800 may sense a position or movement of the electronic device 500 or the user by the gyroscope sensor, the G-sensor, the motion sensor, the infrared (IR) sensor, or the optical sensor included in the sensing unit 900. Here, the motion sensor may be configured as an aggregated including a three-axis acceleration sensor, a three-axis gyroscope, and a digital motion processor.

For example, when the electronic device 500 is an HMD mounted on the head of the user, the control unit may obtain information on the position or movement of the user through a signal recognized from the sensing unit 900, process the information, and display corresponding image information on the display portion.

Alternatively, when the electronic device 500 is a controller interworking with the HMD, the control unit obtains information on the position or movement of the hand holding the controller through a signal recognized from the sensing unit 900, and transfer the information to the HMD or external device wiredly or wirelessly.

In addition, the control unit may detect may detect an object that approaches the electronic device 500 or the user by using the proximity sensor, the illumination sensor, the magnetic sensor, the infrared sensor, the ultrasonic sensor, the optical sensor, or the like included in the sensing unit 900.

Hereinafter, the optical sensor (including the IR sensor) will be described as an example of the sensing unit 900. However, various types of sensors listed above may also be used.

The optical sensor may be used to track a user motion by receiving light emitted from the location tracking device. Alternatively, the optical sensor may receive external light and interwork with a display of the HMD through related information. In addition, the optical sensor may be covered with an infrared filter so as to be protected from an external environment.

Meanwhile, the electronic device 500 may further include a frame 1000 for fixing the circuit board 800. The frame 1000 may be formed of a rigid material relative to the circuit board 800 and may be provided in a shape corresponding to an internal curvature of the cover 600 or may be spaced apart from the cover 600 so that the circuit board 800 is not interfered with by the cover 600.

FIG. 7 is a cross-sectional view illustrating an electronic device 500 according to a comparative embodiment of the present invention.

In an electronic device 500 according to a comparative embodiment, a circuit board 800 and a sensing unit 900 are disposed in an internal space under a cover 600, and a frame 1000 supporting the circuit board 800 is further provided.

In detail, the circuit board 800 is closely attached to the frame 1000 and the sensing unit 900 is mounted at one point of the circuit board 800. The sensing unit 900 includes a sensor part 910 for receiving an external signal and a fixing part 920 for fixing the sensor part 910 to the circuit board 800.

The fixing part 920 may have a flange shape and may be firmly fixed to the circuit board 800 and may include a recess into which the sensor part 910 is inserted at a central portion thereof. The sensor part 910 is inserted into the recess of the fixing part 920, with an upper portion thereof open, to receive an external signal (an optical signal such as a laser or an infrared ray). For example, the sensor part 910 may be a photo diode.

In addition, the fixing part 920 may have a line that connects the sensor part 910 to a circuit of the circuit board 800, and transfer a signal to the microprocessor through the line and the circuit.

A cover 600 is disposed above the circuit board 800. In this case, the cover 600 is fixed at a position spaced apart from the sensor part 910 by a predetermined interval. To this end, the frame 1000 and the cover 600 may be coupled to each other at an interval by which the sensing unit 900 is not interfered. The frame 1000 and the cover 600 may be firmly coupled at a certain interval held therebetween using a bolt or pin structure, for which a rib and boss structure may be formed.

Since an optical signal is to be transmitted to the sensor part 910 through the cover 600, the cover 600 may be formed of a light-transmissive (or translucent) material. Here, the cover 600 may be entirely formed of the light-transmissive material or only a region of the cover 600 where the sensor part 910 is located may be formed of the light-transmissive material. Here, the optical signal is taken as an example but any other external signal may also be transferred through the cover 600.

In the case of an external signal (chemical material, etc.) other than the optical signal, the external signal may enter through an opening (not shown) formed in the cover 600. In this case, the opening of the cover 600 may be filled with a filter member (not shown) to protect the sensing unit 900 from external contaminants or moisture.

Meanwhile, in order to increase sensing efficiency of the sensing unit 900, it is preferable that the optical signal is blocked except for a path through which the optical signal enters the sensor part 910. To this end, a blocking member 700 may be provided on a lower surface of the cover 600, except for a region 710 where the optical signal is incident on the sensor part 910. That is, the blocking member 700 may be provided on the lower surface of the cover 600 and the opening 710 may be formed at a position corresponding to the sensor part 910.

The blocking member 700 may be formed of a material having a low light transmittance. Alternatively, a material having a low external signal transmittance may be used even when the external signal is not an optical signal.

The electronic device 500 according to the comparative embodiment described above has some problems.

First, in order to firmly support the circuit board 800, the separate frame 1000 should be provided. Here, a weight of a material used to form the frame 1000 is heavy and a volume of the electronic device 500 increases by a thickness of the frame 1000. This obstructs the trend of the electronic device 500 to become lighter and smaller.

Second, a spray method is used to form the blocking member 700 on the rear surface of the cover 600, and here, a spray process takes a long time and has a high defect rate, adversely affecting a yield. As the electronic device 500 is miniaturized, the cover 600 has a large amount of curvature, and since a rib and boss structure must be formed on the rear surface of the cover 600 to couple the frame 100 to the cover 600, it may be difficult to manufacture by a method of attaching the blocking member 700 having a film structure. For this reason, the spray method is inevitably used. In order to use the spray method, the region where the sensor part 910 is located is masked and black paint or the like must be sprayed. However, as described above, it is difficult to firmly mask the region due to the rib and boss structure, thereby increasing the process time and the defect rate.

Hereinafter, embodiments of the present invention that solve the above problems will be described.

FIG. 8 is a cross-sectional view illustrating an electronic device 500-1 according to a first embodiment of the present invention.

In comparison with the comparative example 500 illustrated in FIG. 7, in the electronic device 500-1 illustrated in FIG. 8, a circuit board 800-1 is disposed under the cover 600 and the sensing unit 900 is disposed under the circuit board 800-1.

The electronic device 500-1 according to the first embodiment of the present invention adopts the structure in which the circuit board 800-1 by adopting a structure in which the circuit board 800-1 is supported under the cover 600, and thus, the separate frame 1000 (see FIG. 7) is unnecessary. Therefore, the electronic device 500-1 may be miniaturized by the volume occupied by the frame 1000 and be reduced in weight by the weight of the frame 1000.

The circuit board 800-1 may be supported in contact with the cover 600. Such contact may include surface contact or multi-point contact. The circuit board 800-1 may not only be fixed to and supported by the cover 600 through a mechanical coupling structure or may be attached using an adhesive or an adhesive film. By employing such a structure, a separate complicated structure is not necessary on the lower surface of the cover 600, unlike the formation of the rib and boss structure for mechanically coupling the cover 600 and the frame 1000 which are separated from each other in the comparative embodiment illustrated in FIG. 7. Therefore, it is easy to stably support the circuit board 800-1 on the lower surface of the cover 600.

However, in the electronic device 500-1 according to the first embodiment of the present invention, since the sensing unit 900 is coupled to the lower portion of the circuit board 800-1, a path in which an external signal is introduced to the sensor part 910 is necessary. To this end, the circuit board 800-1 includes an opening 810 therein.

In detail, the circuit board 800-1 has the opening 810 penetrating through a region corresponding to the sensing unit 900, and the sensing unit 900 may be fixed around the opening 810 of the circuit board 800-1.

In detail, the sensing unit 900 includes a sensor part 910 positioned inside the opening 810 of the circuit board 800-1 and receiving an external signal introduced through the cover 600 and the opening 810 and a fixing part 920 extending to the periphery of the opening 810 and fixed thereto. For example, the fixing part 920 may have a flange shape extending in a width direction of the circuit board 800-1, and the fixing part 920 may be coupled to the circuit board 800-1 by a screw or a pin coupling structure or fixed by an adhesive.

The electronic device 500 may further include a blocking member 700 between the cover 600 and the circuit board 800-1.

The blocking member 700 may be provided in the form of a film. In this case, the blocking member 700 may be attached to the lower surface of the cover 600 or an upper surface of the circuit board 800-1. As described above, since the shape of the lower surface of the cover 600 is simplified and the blocking member 700 is provided through the film method, without using the spray method, the manufacturing process is simplified and a defect rate may be significantly reduced.

Alternatively, the blocking member 700 may be integrally formed with the cover 600. Here, the integrally forming means that the blocking member 700 is firmly fixed to the cover 600 in terms of manufacturing process (for example, injection-molding process), rather than using mechanical coupling or rather than being adhered by using a separate adhesive. For example, the cover 600 may be manufactured using a light-transmissive resin and the blocking member 700 may be integrated with one surface of the cover 600 using a non-transmissive resin. A double injection-molding process may be used as a method of integrating the blocking member 700 to the cover 600. Hereinafter, the process will be described with reference to FIG. 9.

Figure 9:
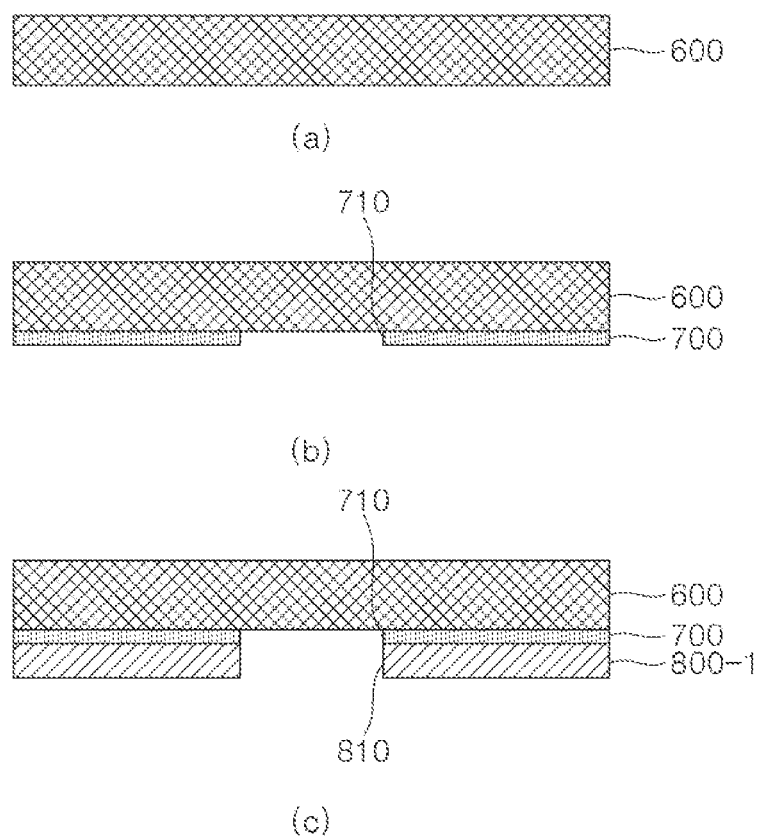
FIG. 9 is a view illustrating a process of manufacturing an electronic device through a double injection-molding process.

FIG. 9 is a view illustrating a process of manufacturing the electronic device 500-1 by a double injection-molding process.

Referring to (a) of FIG. 9, the cover 600 is manufactured using a light-transmissive resin as a raw material and through an injection-molding process. Referring to (b) of FIG. 9, the blocking member 700 is formed using a non-transmissive resin on one surface of the cover 600 by a double injection-molding method. The blocking member 700 may be integrally formed with the cover 600 during the dual injection-molding process. Here, the non-transmissive resin 700 is injected to form the opening 710 in a region where the sensing unit 900 is disposed. As such, since the double injection-molding process is used, there is no need to perform a separate masking process to form the opening 710. Finally, referring to (c) of FIG. 9, the circuit board 800-1 is coupled to one surface of the blocking member 700 and the sensing unit 900 is coupled to the opening 810 of the circuit board 800-1, thereby completing the process.

Figure 10:
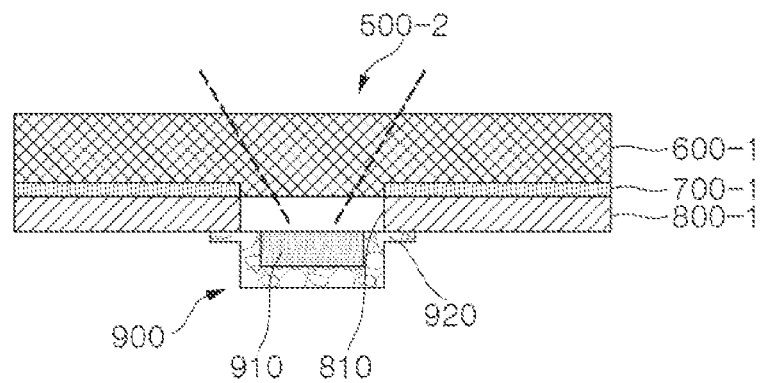
FIG. 10 is a cross-sectional view illustrating an electronic device according to a second embodiment of the present invention.

FIG. 10 is a cross-sectional view illustrating an electronic device 500-2 according to a second embodiment of the present invention.

Referring to FIG. 10, the electronic device 500-2 according to the second embodiment of the present invention may have a dual structure in which a region of a cover 600-1 where a blocking member 700-1 is formed and a region thereof where the sensing unit 900 is disposed are different. Specifically, a region of the cover 600-1 where the blocking member 700-1 is provided is depressed inward, and the blocking member 700-1 may be provided in the depressed region. In the same sense, the region of the cover 600-1 corresponding to a position where the sensing unit 900 is disposed may protrude and the blocking member 700-1 may be provided around the protrusion.

In the case of the double injection-molding through the method shown in FIG. 10, a thickness occupied by the cover 600-1 and the blocking member 700-1 is advantageously reduced as compared to the double injection-molding through the method as shown in FIG. 9.

Figure 11:
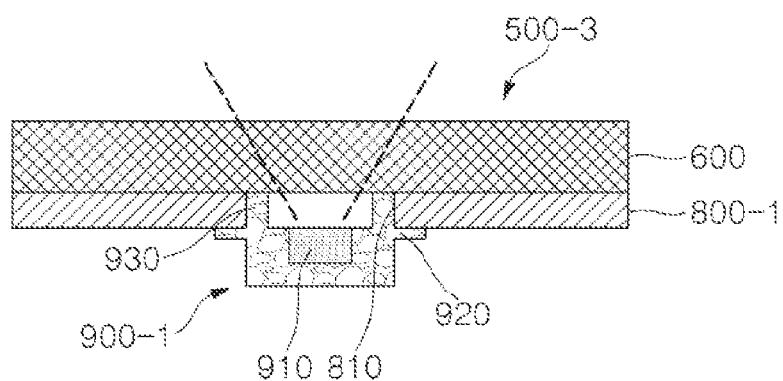
FIG. 11 is a cross-sectional view illustrating an electronic device according to a third embodiment of the present invention.

FIG. 11 is a cross-sectional view illustrating an electronic device 500-3 according to a third embodiment of the present invention.

Referring to FIG. 11, in the electronic device 500-3 according to the third embodiment of the present invention, a sensing unit 900-1 includes a blocking protrusion 930 around the sensor part 910, whereby the separate blocking member 700 (see FIG. 8) may not be used between the cover 600 and the circuit board 800-1.

Specifically, the circuit board 800-1 having an opening 810 is coupled to one surface of the cover 600 and a blocking protrusion 930 of a sensing unit 900-1 may be inserted and coupled to the opening 810 of the circuit board 800-1. The blocking protrusion 930 may be formed of a non-transmissive material or a non-transmissive material may be coated on an inner side thereof.

The blocking protrusion 930 may be provided in a boss shape. For example, the opening 810 of the circuit board 800-1 may have a cylindrical shape, and the blocking protrusion 930 may have a cylindrical shape having a predetermined thickness. Here, an end portion of the blocking protrusion 930 may be in close contact with the cover 600, and in a case where a non-transmissive material is coated on the blocking protrusion 930, the non-transmissive material may also be coated on a surface facing the cover 600.

The sensor part 910 may receive an external signal introduced into the internal space of the blocking protrusion 930.

In the electronic device 500-3 according to the third embodiment of the present invention, an overall thickness may be reduced and a manufacturing process time may be shortened by omitting the sheet-shaped blocking member 700 (see FIG. 8).

Figure 12:
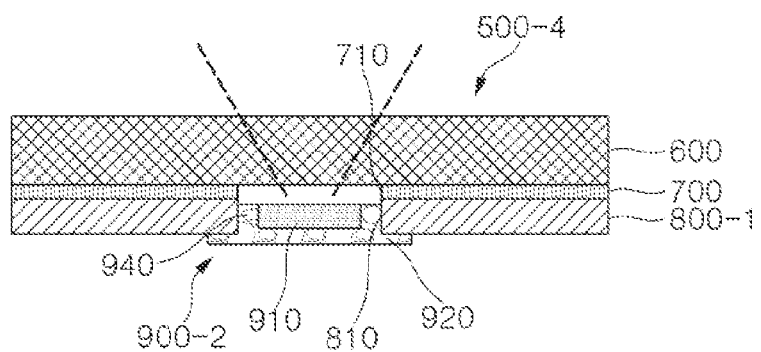
FIG. 12 is a cross-sectional view illustrating an electronic device according to a fourth embodiment of the present invention.

FIG. 12 is a cross-sectional view illustrating an electronic device 500-4 according to a fourth embodiment of the present invention.

Referring to FIG. 12, in the electronic device 500-4 according to the fourth embodiment of the present invention, a region of a sensing unit 900-2 where the sensor part 910 is disposed may be inserted into the opening 810 of the circuit board 800-1. Specifically, the sensing unit 900-2 includes a protruding inserting portion 940 inserted into the opening 810 of the circuit board 800-1 and a fixing part 920 extending outward from one side of the protruding insertion portion 940 and fixed to the circuit board 800-1. For example, the opening 810 of the circuit board 800-1 may have a cylindrical shape, and the protruding insertion portion 940 may have a cylindrical shape in which the sensor part 910 is provided on one surface thereof. In this case, the sensor part 910 may be disposed at a predetermined distance from the cover 600.

In the electronic device 500-4 according to the fourth embodiment of the present disclosure, the sensor part 910 may be disposed inside the opening 810 of the circuit board 800-1, thus reducing an overall thickness.

Particular embodiments or other embodiments of the present invention described above are not mutually exclusive to each other or distinguishable from each other. Individual structures or functions of particular embodiments or other embodiments of the present invention described above may be used in parallel therewith or in combination thereof.

For example, it means that structure A described with reference to a specific embodiment and/or figure and structure B described with reference to other embodiment and/or figure may be combined together. In other words, even if a combination of two different structures is not explicitly indicated, it should be understood that combination thereof is possible unless otherwise stated as impossible.

The detailed descriptions above should be regarded as being illustrative rather than restrictive in every aspect. The technical scope of the present invention should be determined by a reasonable interpretation of the appended claims, and all of the modifications that fall within an equivalent scope of the present invention belong to the technical scope of the present invention.

In the above exemplary systems, although the methods have been described on the basis of the flowcharts using a series of the steps or blocks, the present invention is not limited to the sequence of the steps, and some of the steps may be performed at different sequences from the remaining steps or may be performed simultaneously with the remaining steps. Furthermore, those skilled in the art will understand that the steps shown in the flowcharts are not exclusive and may include other steps or one or more steps of the flowcharts may be deleted without affecting the scope of the present invention.

In the electronic device according to the present invention, since the circuit board on which the sensor is mounted is directly supported on the cover, a separate frame is not necessary, and thus, a volume and weight of the electronic device may be reduced.

Further, according to at least one of the embodiments of the present invention, it is not necessary to perform a spray process to provide a signal blocking member on the inner surface of the cover, and thus, a process time may be shortened and a defect rate may be reduced.

Further, according to at least one of the embodiments of the present invention, a separate blocking member layer provided between the cover and the circuit board may be deleted, thereby shortening a process time and providing a thinner device.

Further, according to at least one of the embodiments of the present invention, a thickness of the device may be reduced by inserting the sensor part into the opening of the circuit board.

What is claimed is:

1. An electronic device comprising:
a cover allowing an external signal to pass therethrough;
a circuit board provided on one side of the cover and having a first opening allowing the external signal to pass therethrough;
a sensing unit provided on one side of the circuit board and having a sensor part provided at a position corresponding to the first opening to receive the external signal; and
a blocking member including a second opening formed at a position corresponding to the first opening to allow the external signal to pass therethrough,
wherein the cover is formed of a light-transmissive resin,
wherein the blocking member is formed of a non-transmissive resin and is formed as a single layer,
wherein the blocking member is integrally formed with the cover,
wherein the cover, the blocking member and the circuit board are each formed in a form of a flat plate, and
wherein the blocking member is thinner than the circuit board.

2. The electronic device of claim 1, wherein
the sensing unit comprises a fixing part fixed around the first opening and an open portion exposed to the inside of the first opening, and the sensor part is provided in the open portion.

3. The electronic device of claim 1, wherein
a distance between an inner surface of the cover and one surface of the circuit board facing the inner surface of the cover is smaller than a distance between the inner surface of the cover and one surface of the sensor part facing the inner surface of the cover.

4. The electronic device of claim 1, wherein
one surface of the blocking member is in contact with one surface of the circuit board facing the blocking member.

5. The electronic device of claim 1, wherein
the blocking member is stacked on one surface of the circuit board.

6. The electronic device of claim 1, wherein
the blocking member is stacked on an inner surface of the cover.

7. The electronic device of claim 1, wherein
a region of the cover corresponding to the second opening is thicker than a region of the cover in which the blocking member is disposed, and
the region of the cover corresponding to the second opening is coplanar with an inner surface of the blocking member.

8. The electronic device of claim 1, wherein
one surface of the sensing unit on which the sensor part is provided is located to be closer to the cover than to one surface of the circuit board facing the cover.

9. The electronic device of claim 8, wherein
the sensing unit comprises an insertion portion inserted into an inner side of the first opening, and the sensor part is provided at an end portion of the insertion portion.

10. The electronic device of claim 9, wherein
the sensing unit further comprises a fixing part protruding radially around the insertion portion and fixed to one side of the circuit board.

11. The electronic device of claim 1, wherein
the electronic device receives the external signal and transfers position information of a body part of a user such that the position information is used in augmented reality (AR).

12. An electronic device including at least one external controller receiving an external signal and transferring position information of a body part of a user and a display device displaying the position information from the external controller on a screen,
wherein the external controller comprises:
a cover allowing the external signal to pass therethrough;
a circuit board provided on one side of the cover and having a first opening allowing the external signal to pass therethrough;
a sensing unit provided on one side of the circuit board and having a sensor part provided at a position corresponding to the first opening to receive the external signal; and
a blocking member including a second opening formed at a position corresponding to the first opening to allow the external signal to pass therethrough,
wherein the cover is formed of a light-transmissive resin,
wherein the blocking member is formed of anon-transmissive resin and is formed as a single layer,
wherein the blocking member is integrally formed with the cover,
wherein the cover, the blocking member and the circuit board are each formed in a form of a flat plate, and
wherein the blocking member is thinner than the circuit board.

13. The electronic device of claim 12, wherein
the display device is a head-mounted display (HMD).

* * * * *